United States Patent [19]

Seymour et al.

[11] Patent Number: 5,459,343
[45] Date of Patent: Oct. 17, 1995

[54] BACK GATE FET MICROWAVE SWITCH

[75] Inventors: David J. Seymour; Frank J. Morris, both of Plano, Tex.

[73] Assignee: Texas Instruments Incorporated, Dallas, Tex.

[21] Appl. No.: 207,247

[22] Filed: Mar. 4, 1994

Related U.S. Application Data

[63] Continuation of Ser. No. 842,272, Feb. 21, 1992, abandoned.

[51] Int. Cl.$^6$ .............................. H01L 29/78; H01L 29/80
[52] U.S. Cl. ........................... 257/275; 257/260; 257/271; 257/287; 257/664
[58] Field of Search ...................................... 257/280, 281, 257/284, 279, 275, 287, 260, 266, 271, 287, 275, 276, 277, 279, 664

[56] References Cited

U.S. PATENT DOCUMENTS

| | | | |
|---|---|---|---|
| 4,737,837 | 4/1988 | Lee | 257/271 |
| 4,814,836 | 3/1989 | Thompson | 257/279 |
| 4,914,491 | 4/1990 | Vu | 257/260 |
| 4,916,090 | 4/1990 | Motai et al. | 257/349 |
| 4,921,814 | 5/1990 | Ishikawa et al. | 257/271 |
| 4,977,434 | 12/1990 | Delagebeaudeuf et al. | 257/287 |
| 5,140,391 | 8/1992 | Hayashi et al. | 257/347 |

FOREIGN PATENT DOCUMENTS

| | | | |
|---|---|---|---|
| 58-114461 | 7/1983 | Japan | 257/280 |
| 60-068661 | 4/1985 | Japan | 257/280 |
| 63-209179 | 8/1988 | Japan | 257/280 |
| 04023474 | 1/1992 | Japan | 257/280 |

OTHER PUBLICATIONS

Liechti, "Microwave Field–Effect Transistors—1976", IEEE Transactions on Microwave Theory and Techniques, vol. MTT–24, No. 6, Jun. 1976, pp. 279–299.

*Primary Examiner*—Mahshid D. Saadat
*Attorney, Agent, or Firm*—Michael K. Skrehot; James C. Kesterson; Richard L. Donaldson

[57] ABSTRACT

A semiconductor device which includes a channel region of predetermined conductivity type having a pair of opposing surfaces (11 or 33), a control element of opposite conductivity type disposed on one of the opposing surfaces (13 or 31) and a pair of spaced apart electrodes (17, 19 or 35, 37) disposed over the other of the opposing surfaces. The control element and channel region form a pn junction therebetween. An electrically insulating layer (15) can be disposed between the spaced apart electrodes (17, 19) and the channel region (11) in a high frequency embodiment.

19 Claims, 2 Drawing Sheets

BACK GATE FET MICROWAVE SWITCH

This application is a Continuation of application Ser. No. 07/842,272, filed Feb. 21, 1992, now abandoned.

BACKGROUND OF THE INVENTION

FIELD OF THE INVENTION

This invention relates to FET circuits and, more specifically, to an FET microwave switch having a back gate as the control element.

BRIEF DESCRIPTION OF THE PRIOR ART

In the prior art design of FETs, including FETs for use at microwave frequencies, the gate electrode has been disposed in the active region of the device between the source and drain electrodes with source-drain spacing being limited by the gate length. There has been a conflict between gate length and gate width at the depleted region to increase the figure of merit (fm) of the device (Explain).

In any control application, the two major design parameters are the ON impedance ($Z_{on}$) and OFF impedance ($Z_{off}$). When a monolithic semiconductor element is used in a control application, the main component of the OFF impedance is the reactive impedance of the terminal-to-terminal capacitance ($C_{off}$) and, in the case of an FET, the ON impedance is the resistance directly under the gate at zero drain-to-source voltage ($R_{on}$). Figure of merit (fm) has been defined as $\frac{1}{2}(\pi)R_{on}C_{off}$. It is therefor apparent that the figure of merit is inversely proportional to both $R_{on}$ and $C_{off}$ in a monolithic semiconductor element. It follows that improvement of the figure of merit is based upon the reduction of either or both of the OFF capacitance and the ON resistance of the monolithic semiconductor element.

SUMMARY OF THE INVENTION

In accordance with the present invention, the above noted problems of the prior art are minimized by eliminating the standard gate at its location on the FET between the source and drain electrodes on the active side of the monolithic semiconductor device and, in place thereof, providing a back gate to the FET wherein the control element is remote from the active region of the device and provides DC isolation of the signal from the gate control. The gate can be biased for negative or positive bias.

BRIEF DESCRIPTION OF THE DRAWINGS

FIG. 7b is a cross-section taken along the line 7b—7b of FIG. 7a.

DESCRIPTION OF THE PREFERRED EMBODIMENTS

Figure 1:
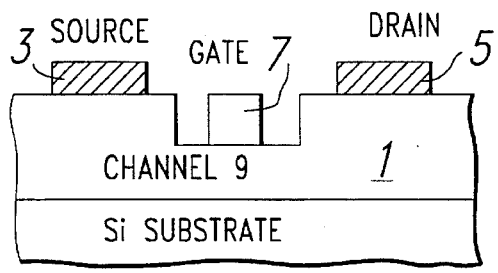
FIG. 1 is a cross-section of a typical prior art FET with all electrodes on the active surface.

Referring first to FIG. 1 there is shown a typical prior art FET. The FET includes a substrate 1 with source 3 and drain 5 electrodes thereon and a gate electrode 7 with channel 9 thereunder between the source and drain electrodes.

In a prior art device of the type shown in FIG. 1, the distance between the source 3 and drain 5 is limited by the length of the gate electrode 7 as well as limitations in photolithographic techniques. It is apparent that, despite the physical reduction in gate length that can be obtained due to improved technology, there must always be some finite gate length. Therefore, there is always some capacitance between the gate Schottky region and the channel. A shorter gate length means lower resistance in the channel and also tighter lithography requirements. The Schottky diode limits the gate/drain or gate/source breakdown since it is on the surface and limited by surface effects. To materially minimize any capacitance in the channel region it would be necessary to reduce the gate size to zero or essentially eliminate the gate electrode completely from the active side of the device. Clearly, this cannot be done in the prior art FET.

Figure 2:
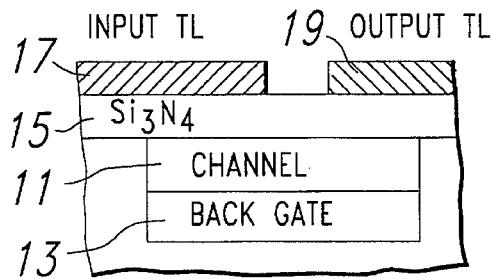
FIG. 2 is a cross-section of a first embodiment of a monolithic semiconductor element in accordance with the present invention.
Figure 3:
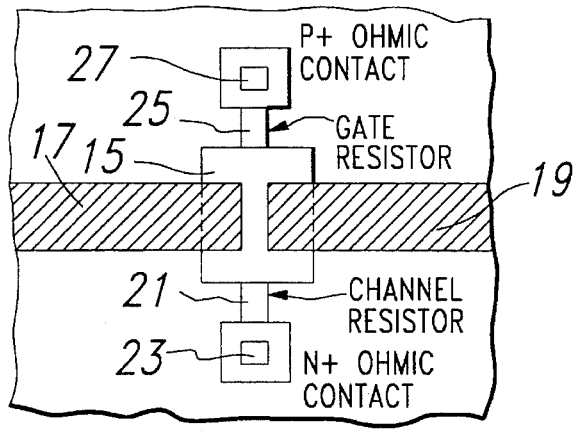
FIG. 3 is a top view of the element of FIG. 2.

With reference now to FIGS. 2 and 3, there is shown a first embodiment of an FET in accordance with the present invention wherein the gate electrode has been removed from the active region and replaced as a back gate. The FET of FIG. 2 includes a semiconductor substrate having a channel region 11 of one conductivity type, a back gate 13 on one surface of the channel region of opposite conductivity type forming a pn junction with the channel region and which performs the function of the gate electrode 7 of FIG. 1, an insulating layer 15, preferably but not limited to silicon nitride, on the opposing surface of the semiconductor substrate from the back gate and input and output transmission lines 17 and 19 respectively spaced from the channel 11 and capacitively coupled thereto disposed on the insulating layer. As shown in FIG. 3, the channel region 11 is coupled via a channel resistor 21 to an N+ ohmic contact 23 when the channel region is N-type and the back gate 13 is P-type and the back gate is coupled via a gate resistor 25 to a P+ ohmic contact 27. The back gate 13 can have a negative voltage relative to the channel region by applying, for example, ground to the channel 11 via ohmic contact 23 and channel resistor 21 and a negative voltage to the back gate via contact 27 and resistor 25.

The resistivity in the channel 11 is controlled by the voltage relative to the channel region applied to the back gate 13 via contact 27 and resistor 25. When the back gate is positive relative to the channel, the depletion layer width is zero and the FET or control element is on and conducts a high frequency signal (e.g., 3 to 4 GHz) through the nitride layer 15 and the channel 11. When the back gate 13 is negative relative to the channel, the depletion layer extends through the channel and the P layer and pinches off the control element and back gate 13. The FET device can operate with a positive or negative control voltage, depending upon whether the back gate 13 or the channel 11 is grounded. The back gate 13 is isolated through this depleted layer and the resistance in the gate and channel.

In operation, there is a capacitive coupling between the input transmission line 17 and the channel 11 and between the channel 11 and the output transmission line 19 with the silicon nitride layer 15 acting as the capacitor dielectric. There is no direct current. The input signal would preferably be greater than the 3 to 4 GHz range. By placing a positive voltage, which can be constant or variable, on the back gate contact 13 relative to the channel 11, there will be conduction from the input line 17 through the nitride layer 15 and then through the channel 11 and back through the nitride layer 15 to the output line 19. This conduction is turned off by placing a negative voltage on the back gate contact 27 relative to the channel 11. The amount of conduction in the conducting mode will depend upon the voltage difference between the channel region 11 and the back gate 13 as would be readily apparent as well as on the doping and thickness of the layers. The ideal profile is that the N (channel region) and P (backgate) layers be completely depleted at the pinch off voltage ($V_{po}$) required by the system, the N layer being depleted first.

Figure 4:
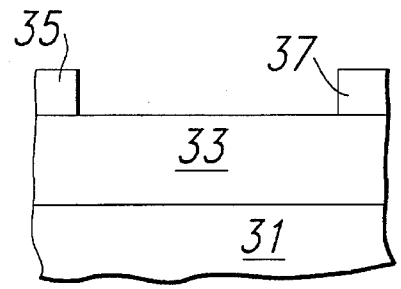
FIG. 4 is a cross-section of a second embodiment in accordance with the present invention.

Referring now to FIG. 4, there is shown a second embodiment in accordance with the present invention. This embodiment includes a substrate or channel region 33 of one conductivity type, for example N-type, having source and drain electrodes 35 and 37 respectively on a surface thereof. The spacing of the electrodes 35 and 37 can be as close as desired within the limitations of processing techniques. The back gate 31 is of opposite conductivity type to that of the substrate or channel region 33, for example P-type. It can be seen that the embodiment of FIG. 4 is identical to that of FIGS. 2 and 3 except for the omission of the nitride layer 15.

The embodiment of FIG. 4 operates in the same manner as described above for the embodiment of FIGS. 2 and 3 except that a direct current can be applied between the source and drain electrodes 35 and 37 via the channel region 33. Again, when the back gate 31 has a positive voltage applied thereto relative to the channel 33, the device will conduct. Similarly, when the back gate 31 has a negative voltage applied thereto relative to the channel 33, the device will be non-conducting. The amount of conduction in the conducting mode will depend upon the voltage difference between the channel region 33 and the back gate 31 as would be readily apparent as well as the doping and thickness of the layer. The ideal profile is that the N (channel region) and P (backgate) layers be completely depleted at the pinch off voltage ($V_{po}$) required by the system, the N layer being depleted first. These voltages will, of course, be reversed if the conductivity type of the channel 33 and back gate 31 are reversed so that the channel region is P-type and the back gate is N-type.

Figure 5A:
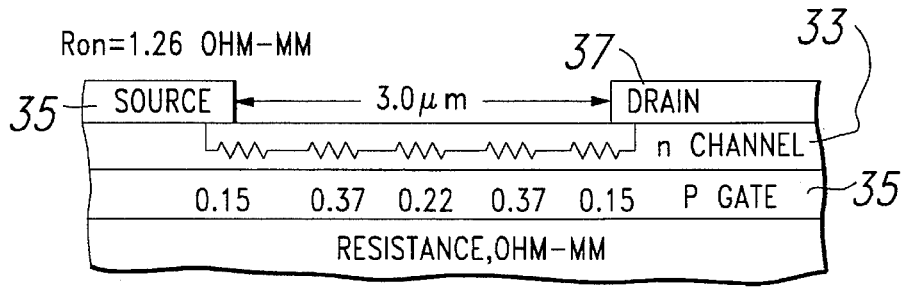
FIG. 5a and 5b represent a comparison of impedance of a prior art FET with that of FIG. 3 in the ON state.
Figure 5B:
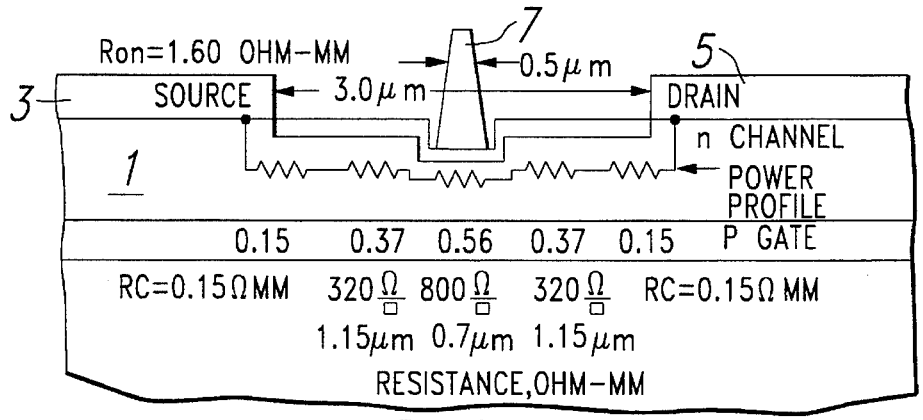

Referring now to FIGS. 5a and 5b, FIG. 5a shows a back gate FET of the type set forth in FIG. 4 in the ON state with source 35 and drain 37 electrodes, an n-channel region 33 and a p-type back gate 31. It can be seen that the resistance in ohm-mm is 0.15 at the source and drain regions, 0.37 in the channel regions other than the channel region below the region where the gate would be in the prior art and 0.22 in that region below the region where the gate would be in the prior art. On the other hand, as shown in FIG. 5b, which is a structure of the type shown in FIG. 1, the resistances are the same except that the resistance under the gate 7 is greater than in the same region wherein the back gate 35 replaces the gate 7. In FIGS. 5a and 5b, the distance between source and drain is the same although, as noted above, this distance can be reduced to a greater extent in the embodiment of FIG. 5a since there is no requirement for a gate electrode on the active surface of the device.

Figure 6A:
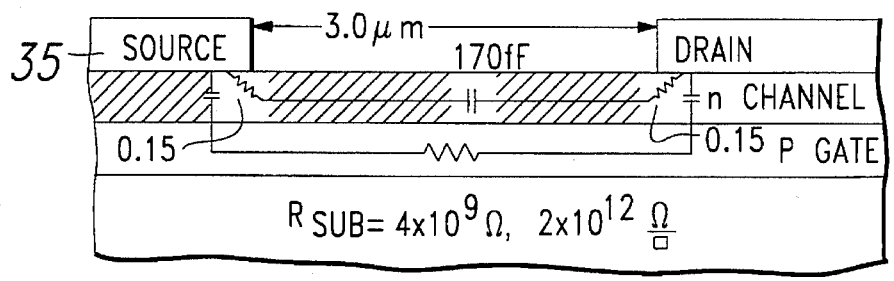
FIG. 6a and 6b represent a comparison of impedance of a prior art FET with that of FIG. 3 in the OFF state.
Figure 6B:
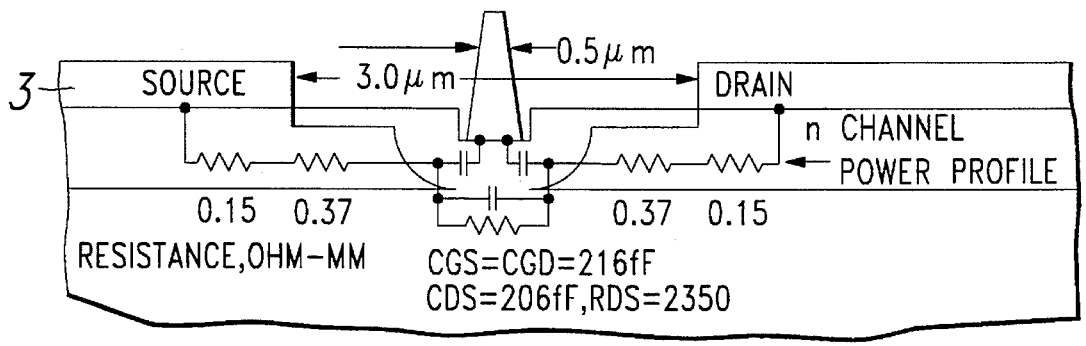

Referring now to FIGS. 6a and 6b, these figures are identical to FIGS. 5a and 5b except that the transistors are now in the OFF state. In this condition it can be seen that the resistance at the source and drain remains the same as in FIGS. 5a and 5B. However, in the prior art structure of FIG. 6b the channel resistance remains the same and there is a capacitance of 216 fF between the gate and source and between the gate and drain and a capacitance of 206 fF between the source and drain as well as a resistance of 2350 ohm-mm between the source and drain in the channel region. In the structure of FIG. 6a there is merely a capacitance of 170 fF between the source and drain and a resistance of $4 \times 10^9$ ohms between the source and drain.

It follows from an analysis of FIGS. 5a, 5b, 6a and 6b that the structure of the present invention provides a much higher OFF impedance with lower capacitance than does the prior art and provides a lower ON resistance in the channel in the region that would be under the gate in the prior art FET devices. Accordingly, the figure of merit has been materially improved.

Figure 7A:
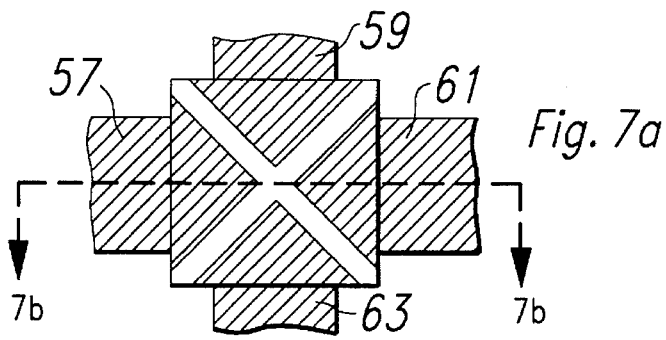
FIG. 7a is a top view of a further embodiment of the present invention.
Figure 7B:
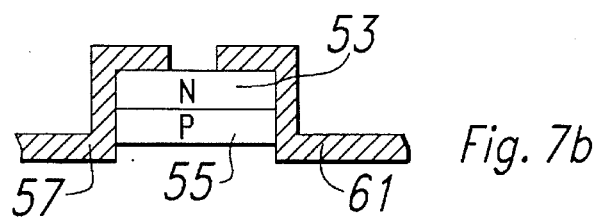

Referring now to FIGS. 7a and 7b, there is shown another embodiment of the invention similar to that of FIG. 4 having a channel region 53 and a backgate 55 with four spaced apart contacts 57, 59, 61 and 63 on the surface of the channel region 53. An input can be provided along any one or more of the contacts 57, 59, 61 and 63 with one or more of the remaining contacts providing an output. In this way, a four element control device is provided. While the shape of the contacts 57, 59, 61 and 63 has been shown to be triangular over the channel region 53, other shapes can be used without departing from the invention. Also, the number of contacts can be greater or less than the four as shown.

As a yet further embodiment, an insulating layer (not shown) of the type shown as 15 in FIG. 2 can be disposed over the channel layer 53 with the contacts disposed over the insulating layer rather than over the channel layer. In this case, operation would be as discussed above with reference to FIG. 2 with inputs and outputs as discussed above with reference to FIGS. 7a and 7b.

Though the invention has been described with respect to specific preferred embodiments thereof, many variations and modifications will immediately become apparent to those skilled in the art. It is therefore the intention that the appended claims be interpreted as broadly as possible in view of the prior art to include all such variations and modifications.

We claim:

1. A semiconductor device which includes:
   (a) a channel region of predetermined conductivity type having a pair of opposing surfaces;
   (b) a control element of opposite conductivity type disposed on only one of said opposing surfaces;
   (c) at least three electrodes spaced apart over said other of said opposing surfaces such that a path unobstructed by any other electrodes exists over said surface between any two of said electrodes; and
   (d) an electrically insulating layer disposed between said spaced apart electrodes and said channel layer.

2. The device of claim 1 wherein said control element and said channel region form a pn junction therebetween.

3. The device of claim 1 wherein said spaced electrodes are disposed in contact with said insulating layer.

4. The device of claim 2 wherein said spaced electrodes are disposed in contact with said insulating layer.

5. The device of claim 1 further including means to provide a voltage difference between said channel region and said control element.

6. The device of claim 2 further including means to provide a voltage difference between said channel region and said control element.

7. The device of claim 3 further including means to provide a voltage difference between said channel region and said control element.

8. The device of claim 4 further including means to provide a voltage difference between said channel region and said control element.

9. The device of claim 5 wherein said voltage difference is variable.

10. The device of claim 6 wherein said voltage difference is variable.

11. The device of claim 7 wherein said voltage difference is variable.

12. The device of claim 8 wherein said voltage difference is variable.

13. A semiconductor device which includes:

(a) a channel region of predetermined conductivity type having a pair of opposing surfaces;

(b) a control element of opposite conductivity type disposed on only one of said opposing surfaces; and (c) a pair of spaced apart electrodes disposed over the other of said opposing surfaces, wherein said control element extends between said electrodes, and (d) an electrically insulating layer disposed between said spaced apart electrodes and said channel region.

14. The device of claim 13 wherein said control element and said channel region form a pn junction therebetween.

15. The device of claim 13 further including means to provide a voltage difference between said channel region and said control element.

16. The device of claim 14 further including means to provide a voltage difference between said channel region and said control element.

17. The device of claim 15 wherein said voltage difference is variable.

18. The device of claim 16 wherein said voltage difference is variable.

19. The device of claim 13 further including at least a further electrode spaced apart from said pair of spaced electrodes and disposed over said other of said opposing surfaces.

* * * * *